(12) United States Patent
Liu

(10) Patent No.: US 11,985,813 B2
(45) Date of Patent: May 14, 2024

(54) BIT LINE LEAD-OUT STRUCTURE AND PREPARATION METHOD THEREFOR

(71) Applicant: CHANGXIN MEMORY TECHNOLOGIES, INC., Hefei (CN)

(72) Inventor: ChihCheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 461 days.

(21) Appl. No.: 17/445,948

(22) Filed: Aug. 25, 2021

(65) Prior Publication Data

US 2021/0391336 A1    Dec. 16, 2021

Related U.S. Application Data

(63) Continuation of application No. PCT/CN2021/095062, filed on May 21, 2021.

(30) Foreign Application Priority Data

May 28, 2020    (CN) .......................... 202010465006.1

(51) Int. Cl.
*H01L 27/108*    (2006.01)
*H10B 12/00*    (2023.01)

(52) U.S. Cl.
CPC ........... *H10B 12/482* (2023.02); *H10B 12/30* (2023.02)

(58) Field of Classification Search
CPC ..... H10B 12/482; H10B 12/30; H01L 23/528; H01L 21/76838; H01L 27/105; H01L 2221/1068
See application file for complete search history.

(56) References Cited

U.S. PATENT DOCUMENTS

| 7,413,833 B2 | 8/2008 | Butt |
| 2008/0042171 A1 | 2/2008 | Mosler |
| 2015/0340370 A1* | 11/2015 | Kim ...................... H10B 43/20 |
| | | 438/270 |

FOREIGN PATENT DOCUMENTS

| CN | 107342263 A | 11/2017 |
| CN | 208478283 U | 2/2019 |
| CN | 208655642 U | 3/2019 |
| CN | 109727908 A | 5/2019 |
| CN | 110767538 A | 2/2020 |

OTHER PUBLICATIONS

International Search Report in the international application No. PCT/CN2021/095062, dated Aug. 26, 2021.

* cited by examiner

*Primary Examiner* — Mohammed R Alam
(74) *Attorney, Agent, or Firm* — Syncoda LLC; Feng Ma

(57) ABSTRACT

In a bit line lead-out structure preparation method, a bit line extending in a Y-axis direction is formed on a substrate. A contact via covering the bit line in an X-axis direction is formed, the X-axis direction being perpendicular to the Y-axis direction. A metal wire covering the contact via is formed, the contact via being located between the bit line and the metal wire and being in contact with the bit line and the metal wire respectively, wherein a contact area between the contact via and the metal wire is larger than a contact area between the contact via and the bit line.

9 Claims, 15 Drawing Sheets

BIT LINE LEAD-OUT STRUCTURE AND PREPARATION METHOD THEREFOR

CROSS-REFERENCE TO RELATED APPLICATION

This is a continuation application of International Patent Application No. PCT/CN2021/095062 filed on May 21, 2021, which claims priority to Chinese Patent Application No. 202010465006.1 filed on May 28, 2020. The disclosures of these applications are hereby incorporated by reference in their entirety.

BACKGROUND

A semiconductor memory device implements data access by controlling charging and discharging of a storage capacitor using a transistor array. A drain region of a transistor is electrically connected with a bit line. After the bit line is formed on a substrate, a bit line lead-out structure needs to be formed above the bit line. The bit line is electrically connected with an external control circuit through the bit line lead-out structure.

SUMMARY

The disclosure relates generally to the field of semiconductors, and more specifically to a bit line lead-out structure and a preparation method for a bit line lead-out structure.

An aspect of the application provides a bit line lead-out structure, including: a bit line, extending in a Y-axis direction; a contact via, covering the bit line in an X-axis direction, the X-axis direction being perpendicular to the Y-axis direction; and a metal wire, covering the contact via, the contact via being located between the bit line and the metal wire and in contact with the bit line and the metal wire respectively. A contact area between the contact via and the metal wire is larger than a contact area between the contact via and the bit line.

Another aspect of the application provides a preparation method for a bit line lead-out structure, including: a first dielectric layer is formed on a substrate, a first trench being formed in the first dielectric layer; a bit line extending in a Y-axis direction is formed in the first trench, a top surface of the bit line being lower than a top surface of the first dielectric layer; a contact via layer is formed on the bit line and the first dielectric layer outside the first trench; a metal layer is formed on the contact via layer; and the metal layer and the contact via layer are etched to form the abovementioned bit line lead-out structure.

Details of one or more embodiments of the application will be proposed in the following drawings and descriptions. Other features, objectives, and advantages of the application will become clearer in the specification, the drawings, and the claims.

BRIEF DESCRIPTION OF THE DRAWINGS

In order to describe the technical solutions of the embodiments of the application more clearly, references can be made to one or more drawings. However, appended details or examples for describing the drawings should not be considered as limits to the scope of the creative invention of the application and any one of presently described embodiments or preferred modes.

DETAILED DESCRIPTION

Figure 1:
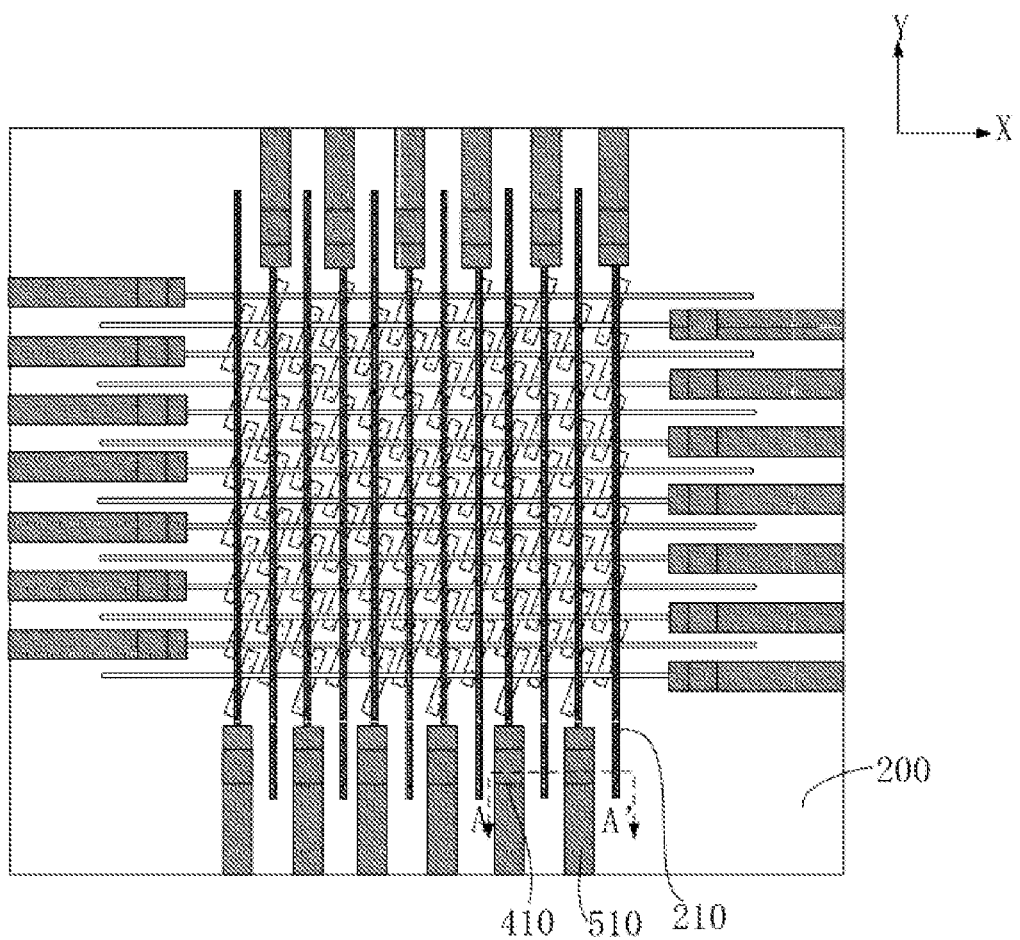
FIG. 1 is a top view of a distribution of a bit line lead-out structure according to an embodiment.

For easily understanding the application, the application will be described more comprehensively below with reference to the related drawings. The drawings show the embodiments of the application. However, the application may be implemented in various forms and is not limited to the embodiments described herein. Instead, these embodiments are provided to make the contents disclosed in the application understood more thoroughly and comprehensively.

Unless otherwise defined, all technical and scientific terms used herein have the same meanings as commonly understood by those skilled in the art of the application. In the disclosure, terms used in the description of the application are only for a purpose of describing specific embodiments and not intended to limit the application.

It is to be understood that the description that an element or layer is "on" may refer to that the element or layer is directly on another element or layer, or there may be an intermediate element or layer. It is to be understood that, although various elements, components, regions, layers, doping types, and/or parts may be described with terms first, second, third, etc., these elements, components, regions, layers, doping types, and/or parts should not be limited to these terms. These terms are used only to distinguish one element, component, region, layer, doping type, or part from another element, component, region, layer, doping type, or part. Therefore, a first element, component, region, layer, doping type, or part discussed below may be represented as a second element, component, region, layer, or part without departing from the teaching of the disclosure.

Spatially relational terms such as "below", "under", "lower", "beneath", "above", and "upper" may be used to describe a relationship between one element or feature and another element or feature illustrated in the figures. It is to be understood that, in addition to the orientation shown in the figures, the spatially relational terms also include different orientations of devices in use and operation. For example, if the devices in the figures are turned over, elements or features described as being "under" or "beneath" or "below" other elements or features will be oriented to be "on" the other elements or features. Therefore, the exemplary terms "under" and "below" may include both upper and lower orientations. In addition, the device may also include other orientations (for example, rotated by 90 degrees or in other orientations), and the spatial descriptors used herein may be interpreted accordingly.

As used herein, singular forms "a/an", "one", and "the" may also include the plural forms, unless otherwise specified in the context. It is also to be understood that terms "include/contain", "have", etc., specify the existence of a stated feature, whole, step, operation, component, part, or a combination thereof, but do not exclude the possibility of existence or addition of one or more other features, wholes, steps, operations, components, parts, or combinations thereof. In addition, term "and/or" in the specification includes any and all combinations of the related listed items.

With the continuous improvement of integration levels of semiconductor devices, sizes of bit lines and spacings between bit lines are continuously reduced, and areas of bit line lead-out structures may also be correspondingly reduced, thus contact resistance between the bit line lead-out structures and the corresponding bit lines is increased, and currents flowing through the bit lines are too low. Therefore, induction margins of semiconductor memories and charging and discharging speeds of storage capacitors are reduced.

Figure 2:
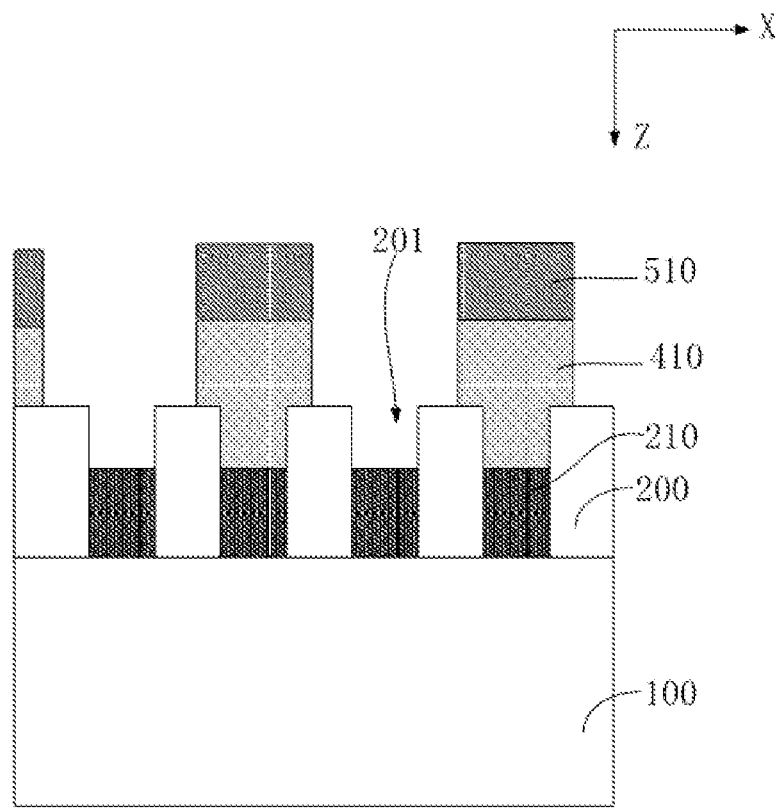
FIG. 2 is a sectional view corresponding to section line AA' in FIG. 1 according to an embodiment.

FIG. 1 is a top view of a bit line lead-out structure according to an embodiment of the application. FIG. 2 is a sectional view corresponding to section line AA' in FIG. 1.

As shown in FIG. 1 and FIG. 2, a bit line lead-out structure includes a bit line 210, a contact via 410, and a metal wire 510.

The bit line 210 extends in a Y-axis direction.

The contact via 410 is above the bit line 210 and covers the bit line 210 in an X-axis direction, the X-axis direction being perpendicular to the Y-axis direction. That the contact via 410 covers the bit line 210 in the X-axis direction refers to that a width of the contact via 410 in the X-axis direction is more than or equal to a width of the bit line 210 in the X-axis direction and a segment of the bit line 210 in the Y-axis direction is covered by the contact via 410.

The metal wire 510 is on the contact via 410 and covers the contact via 410, namely the contact via 410 is between the bit line 210 and the metal wire 510, a bottom surface of the contact via 410 contacts with the bit line 210, and a top surface of the contact via 410 contacts with the metal wire 510. A contact area between the contact via 410 and the metal wire 510 is larger than a contact area between the contact via 410 and the bit line 210, and a width of a contact surface between the contact via 410 and the metal wire 510 in the X-axis direction is greater than a width of a contact surface between the contact via 410 and the bit line 210 in the X-axis direction.

In the bit line lead-out structure, the bit line 210 is formed in a semiconductor device, and the contact via 410 and the metal wire 510 are formed above the bit line 210, so that an external electrical signal may be transmitted to the bit line 210 through the metal wire 510 and the contact via 410, and the semiconductor device may be controlled through the bit line 210. In the application, the contact via 410 covers the bit line 210 in the X-axis direction, the metal wire 510 covers the contact via 410, and the contact area between the contact via 410 and the metal wire 510 is larger than the contact area between the contact via 410 and the bit line 210. After the contact areas between the contact via 410 and the bit line 210 and between the contact via 410 and the metal wire 510 are adjusted, when the contact area between the contact via 410 and the bit line 210 is smaller, the influence of the contact via 410 on an integration level of the device is reduced, and if the contact area between the contact via 410 and the metal wire 510 is larger, contact resistance of the whole bit line lead-out structure can be reduced, thereby improving an induction margin of a semiconductor memory and a charging and discharging speed of a storage capacitor.

In an embodiment, as shown in FIG. 2, a cross section of the contact via 410 is a T-shaped structure, namely a cross section of the contact via 410 in a Z-axis direction shown in FIG. 2 is a T-shaped structure. Among them, the X axis, the Y axis, and the Z axis are perpendicular to each other. In the embodiment, the contact via 410 is a T-shaped structure, and a width of the top surface of the contact via 410 in the X-axis direction is greater than a width of the bottom surface in the X-axis direction, so that the contact area between the contact via 410 and the metal wire 510 is larger than the contact area between the contact via 410 and the bit line 210.

More specifically, the bit line 210 is formed on a substrate 100. A first dielectric layer 200 is formed on the substrate 100, a first trench 201 extending in the Y-axis direction is formed in the first dielectric layer 200, the bit line 210 is specifically filled the first trench 201, and a top surface of the bit line 210 is lower than a top surface of the first dielectric layer 200, namely a thickness of the bit line 210 is less than a depth of the first trench 201. Part of the contact via 410 is filled in the first trench 201, and the contact via 410 outside the first trench 201 extends to the first dielectric layer 200 on two sides of the bit line 210 in the X-axis direction. In such case, the contact via 410 in the first trench 201 and the contact via 410 outside the first trench 201 form the contact via 410 of the T-shaped structure. Furthermore, a width of the metal wire 510 above the contact via 410 in the X-axis direction is equal to the width of the contact via 410 in the X-axis direction, and lateral surfaces of the contact via 410 and the metal wire 510 extending in the Y-axis direction are aligned with each other.

In an embodiment, as shown in FIG. 1 and FIG. 2, the bit line lead-out structure includes 2*N bit lines 210, each bit line 210 is distributed in parallel in the X-axis direction, 2*N contact vias 410 are formed in the 2*N bit lines 210 respectively, 2*N metal wires 510 are formed on the 2*N contact vias 410 respectively, and each metal wire 510 extends in the Y-axis direction. Herein, N is a positive integer, and the 2*N bit lines 210, the 2*N contact vias 410, and the 2*N metal wires 510 are in one-to-one correspondence. In the embodiment, the 2*N bit lines 210 distributed in parallel in the X-axis direction are formed on the substrate 100, and a contact via 410 and a metal wire 510 corresponding to each bit line 210 are formed above each bit line 210, namely each bit line 210 corresponds to an independent bit line lead-out structure, so that each bit line 210 may be controlled independently. Furthermore, the 2*N bit lines 210 are aligned in the X-axis direction, namely lengths of the 2*N bit lines 210 in the Y-axis direction are the same, and end points of the bit lines 210 are aligned in the X-axis direction.

More specifically, as shown in FIG. 1, N metal wires 510 and N contact vias 410 are on one side of the bit lines 210 in the Y-axis direction, and the other N metal wires 510 and the other N contact vias 410 are on the other side of the bit lines 210 in the Y-axis direction. The metal wires 510 on the same side are distributed in parallel in the X-axis direction.

In the embodiment, 2*N lead-out structures formed by the 2*N contact vias 410 and the 2*N metal wires 510 are divided into totally two groups of lead-out structures, the first group of lead-out structures include N contact vias 410 and N metal wires 510 contacting with the N contact vias 410, and the second group of lead-out structures include the other N contact vias 410 and the other N metal wires 510 contacting with the those N contact vias 410. The lead-out structure of the first group is close to the end point of one end of the bit line 210, and the lead-out structure of the second group is close to the end point of the other end of the bit line 210. The metal wires 510 and the contact vias 410 are distributed on the two sides of the bit lines 210, so that the width of the metal wire 510 or the contact via 410 can be appropriately increased, thereby reducing the contact resistance of the bit line lead-out structure.

Furthermore, the contact via 410 on one side of the bit line 210 covers an odd-numbered bit line 210, and the contact via 410 on the other side of the bit line 210 covers an even-numbered bit line 210. In the embodiment, the 2*N bit lines 210 are sequentially arranged in the X-axis direction, the first group of lead-out structures are arranged on the odd-numbered bit lines 210, and the second group of lead-out structures are arranged on the even-numbered bit lines 210, so that a distance between adjacent contact vias 410 can be increased, the widths of the contact via 410 and the metal wire 510 can further be increased, the contact areas may be enlarged, and the contact resistance can be reduced.

In an embodiment, the contact via 410 and the metal wire 510 have different electrical conductivities, namely materials for the contact vias 410 and the metal wires 510 are different. Specifically, the material for the contact via 410 may be a metal alloy including one or more of copper, aluminum, nickel, tungsten, silver, gold, etc., and the metal wire 510 may be one of a tungsten wire, an aluminum wire, a copper wire, a silver wire, a gold wire, etc.

Figure 3:
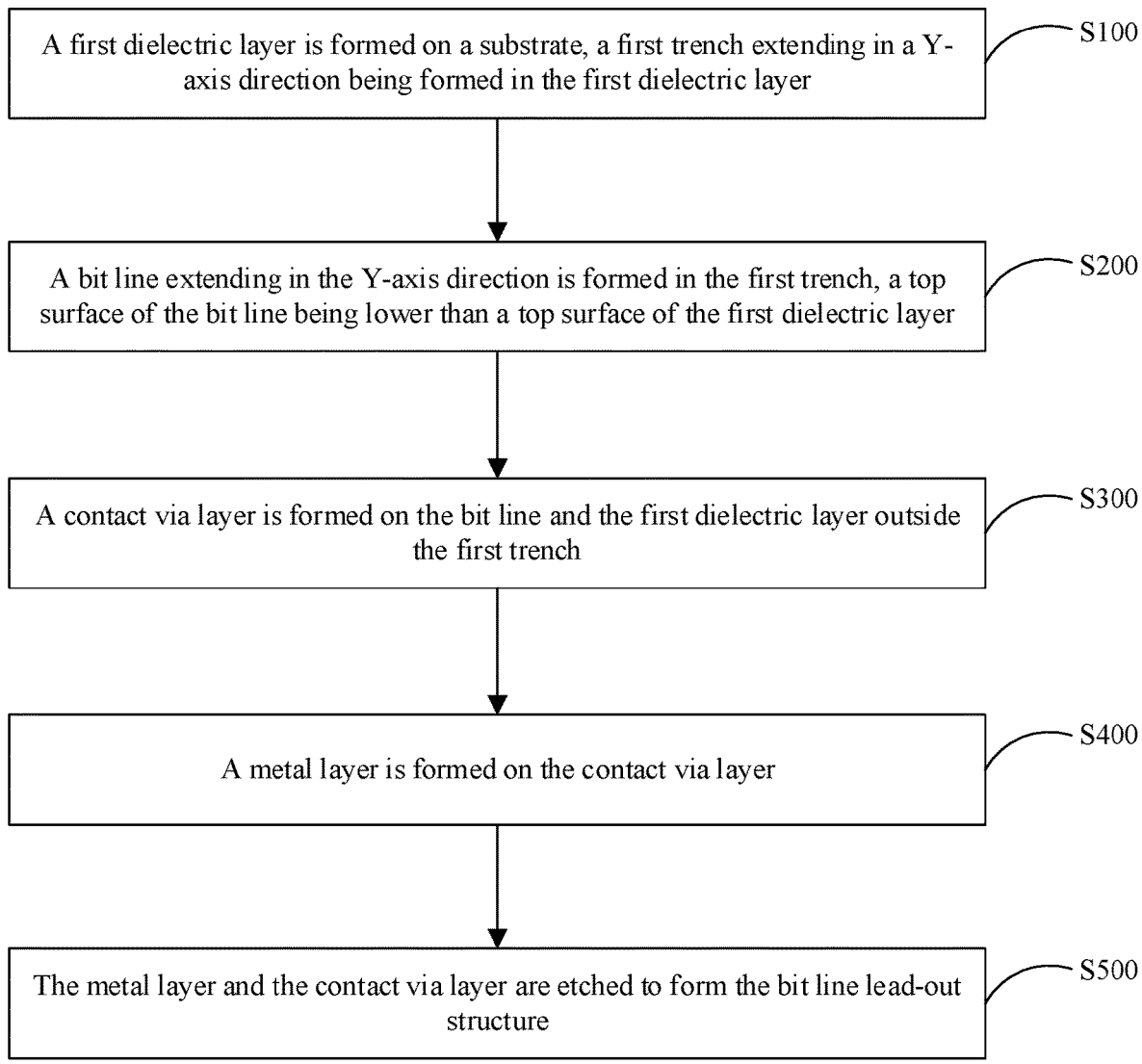
FIG. 3 is a step flowchart of a preparation method for a bit line lead-out structure according to an embodiment.

FIG. 3 shows a preparation method for a bit line lead-out structure according to an embodiment of the application.

In an embodiment, the preparation method for the bit line lead-out structure includes the following operations.

In S100, a first dielectric layer is formed on a substrate, a first trench extending in a Y-axis direction being formed in the first dielectric layer.

In S200, a bit line extending in the Y-axis direction is formed in the first trench, a top surface of the bit line being lower than a top surface of the first dielectric layer.

Figure 4A:
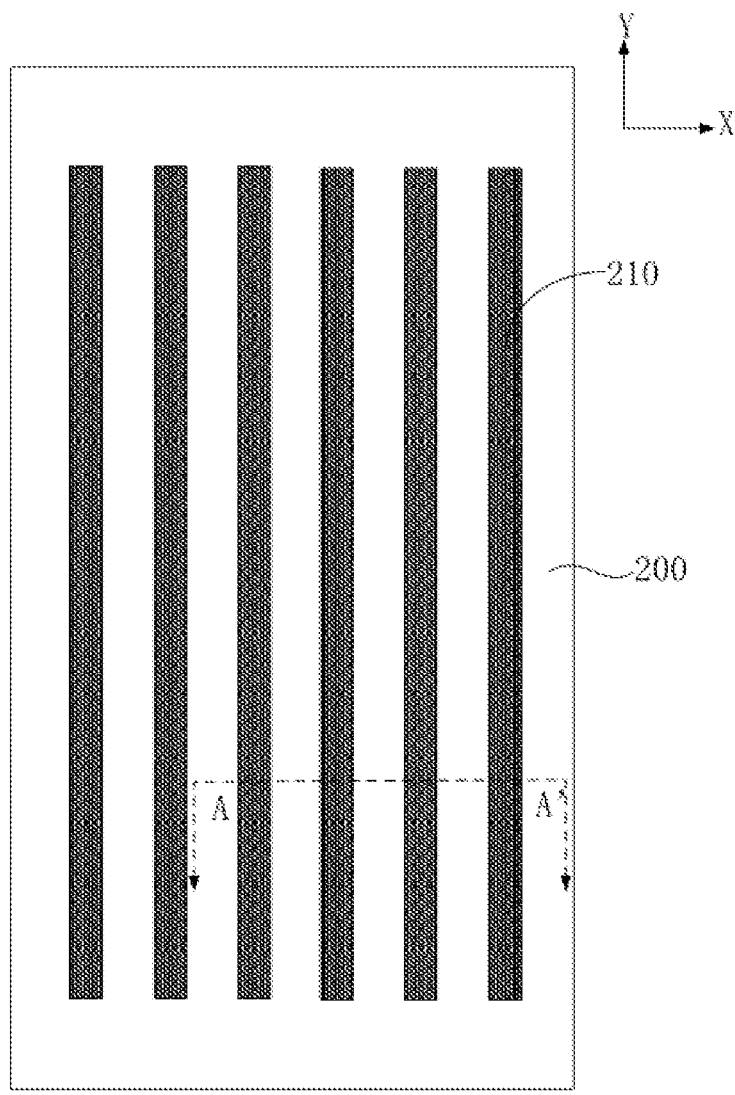
FIG. 4A is a top view after bit lines are formed according to an embodiment.
Figure 4B:
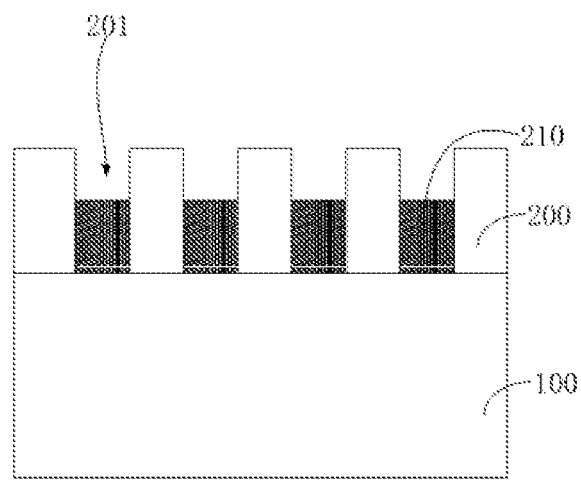
FIG. 4B is a sectional view corresponding to section line AA' in FIG. 4A according to an embodiment.

In combination with FIG. 4A and FIG. 4B, FIG. 4A is a top view after bit lines 210 are formed, and FIG. 4B is a sectional view corresponding to section line AA' in FIG. 4A.

The first dielectric layer 200 is formed on the substrate 100, and the first trench 201 is formed in the first dielectric layer 200. In a specific embodiment, the first dielectric layer 200 is deposited at first through a deposition process, and then the first dielectric layer 200 is etched to form the first trench 201.

The bit line 210 extending in the Y-axis direction is formed in the first trench 201, and the top surface of the bit line 210 is lower than the top surface of the first dielectric layer 200, namely a thickness of the bit line 210 is less than a depth of the first trench 201.

In a specific embodiment, as shown in FIG. 4A, 2*N first trenches 201 extending in the Y-axis direction respectively are formed in the first dielectric layer 200, each trench is distributed in parallel in an X-axis direction, 2*N bit lines 210 extending in the Y-axis direction are formed in the 2*N first trenches 201, and each bit line 210 is distributed in parallel in the X-axis direction. Furthermore, each bit line 210 is arranged in an aligned manner in the X-axis direction, namely lengths of the 2*N bit lines 210 in the Y-axis direction are the same, and end points of the bit lines 210 are aligned in the X-axis direction.

In a specific embodiment, a process of forming the bit line 210 includes the following operations.

In S210, a bit line material layer is deposited on the first dielectric layer in the first trench and outside the first trench.

Specifically, the bit line material layer is deposited through the deposition process. The bit line material layer has a certain thickness and covers the first trench 201 and the first dielectric layer 200.

In S220, a top surface of the bit line material layer is flattened to remove the bit line material layer on the first dielectric layer and retain the bit line material layer in the first trench.

After the bit line material layer is deposited, the bit line material layer has a rough upper surface. Then, the upper surface of the bit line material layer is polished through a chemical mechanical polishing process to flatten the upper surface of the bit line material layer, the bit line material layer is etched to expose the first dielectric layer 200 and retain the bit line material layer in the first trench 201.

In S230, the bit line material layer in the first trench is etched back to remove part of the bit line material layer at a top of the first trench and retain part of the bit line material layer at a bottom of the first trench to form the bit line.

Specifically, the bit line material layer in the first trench 201 is specifically etched through an etching process to reduce the thickness of the bit line material layer to make the thickness of the bit line material layer less than the depth of the first trench 201, and after etching is stopped, the retained bit line material layer forms the bit line 210. An etching-back depth of the bit line material layer may be flexibly selected as specifically required.

After the bit line 210 is formed, the following operations are continued to be executed.

In S300, a contact via layer is formed on the bit line and the first dielectric layer outside the first trench.

In an embodiment, the contact via layer 400 can directly be formed on the bit line 210 and the first dielectric layer 200 outside the first trench 201.

In another embodiment, S300 may include the following sub steps.

In S311, a second dielectric layer is formed on the first dielectric layer and the first trench.

The second dielectric layer 300 is deposited on the first dielectric layer 200 and the first trench 201 through the deposition process, and a top surface of the second dielectric layer 300 is polished to flatten the top surface of the second dielectric layer 300.

In S312, the second dielectric layer is etched to form a second trench extending in an X-axis direction, the second trench penetrating through the second dielectric layer and exposing the bit line and the first dielectric layer.

Figure 5A:
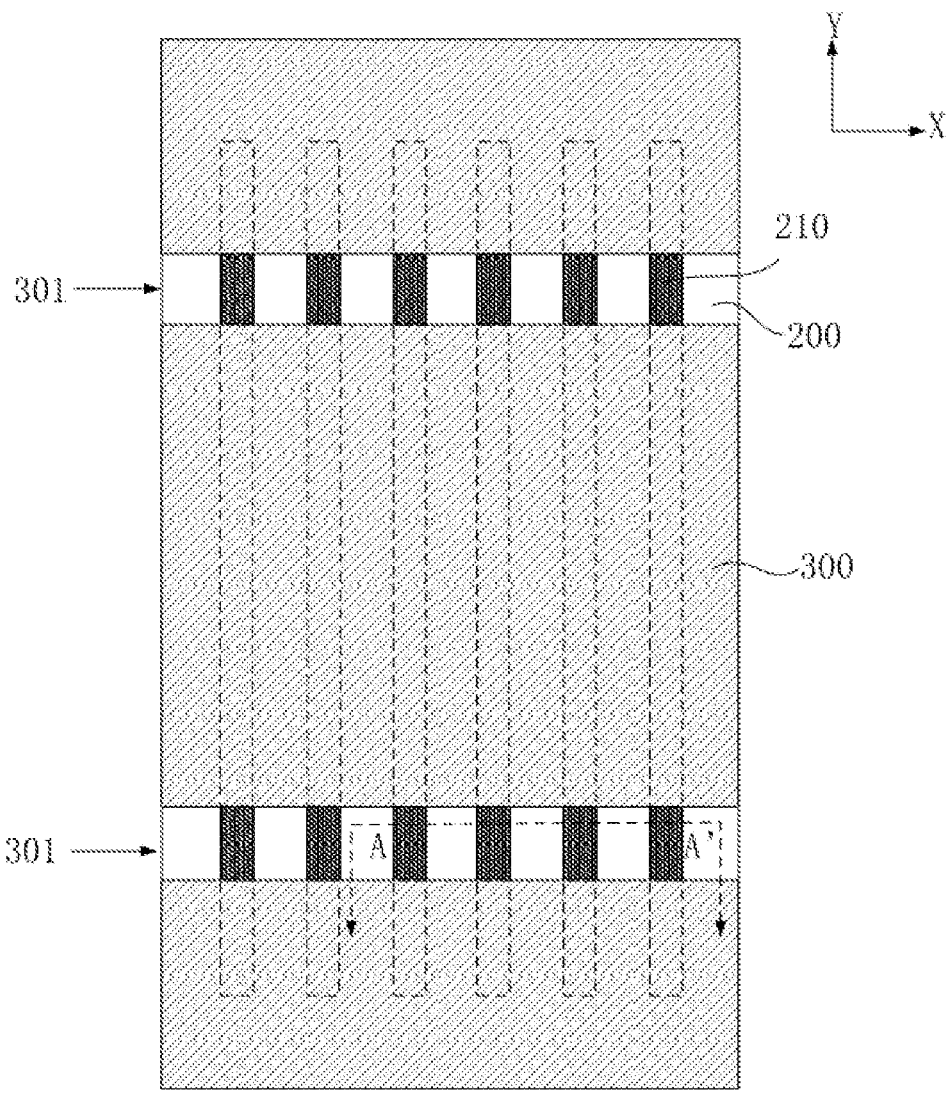
FIG. 5A is a top view after second trenches are formed in a second dielectric layer according to an embodiment.
Figure 5B:
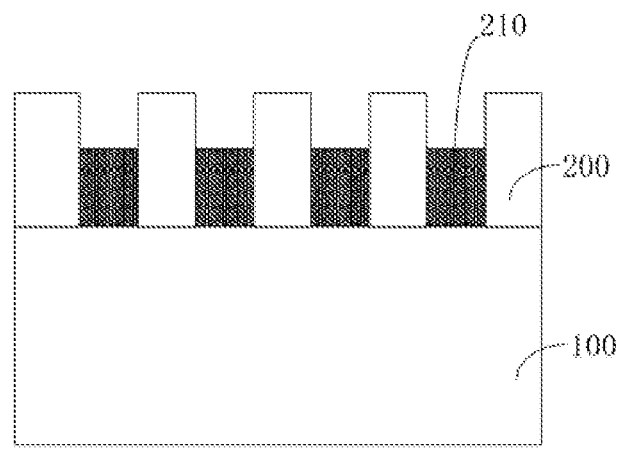
FIG. 5B is a sectional view corresponding to section line AA' in FIG. 5A according to an embodiment.

As shown in FIG. 5A and FIG. 5B, FIG. 5A is a top view after second trenches 301 are formed in a second dielectric layer 300, and FIG. 5B is a sectional view corresponding to section line AA' in FIG. 5A. The second dielectric layer 300 is etched to form the second trench 301 extending in the X-axis direction in the second dielectric layer 300. The second trench 301 penetrates through the second dielectric layer 300 in a Z-axis direction and exposes the bit line 210 and first dielectric layer 200 at the bottom of the second trench 301. It is to be noted that, in the embodiment, the etching selectivity of the second dielectric layer 300 and the first dielectric layer 200 is different, so the first dielectric layer 200 may substantially not be etched when the second dielectric layer 300 is etched to form the second trench 301.

In an embodiment, as shown in FIG. 5A, two second trenches 301 extending in the X-axis direction respectively are formed in the second dielectric layer 300. One second trench 301 is on the side, extending in the Y-axis direction of the bit line 210, and the other second trench 301 is on the other side, extending in the Y-axis direction, of the bit line 210. That is, the two second trenches 310 are distributed in parallel in the Y-axis direction. Furthermore, the two second trenches 301 are respectively close to the end points of the two sides of the bit line 210 in the Y-axis direction.

In S313, the contact via layer is formed in the first trench and the second trench.

Figure 6A:
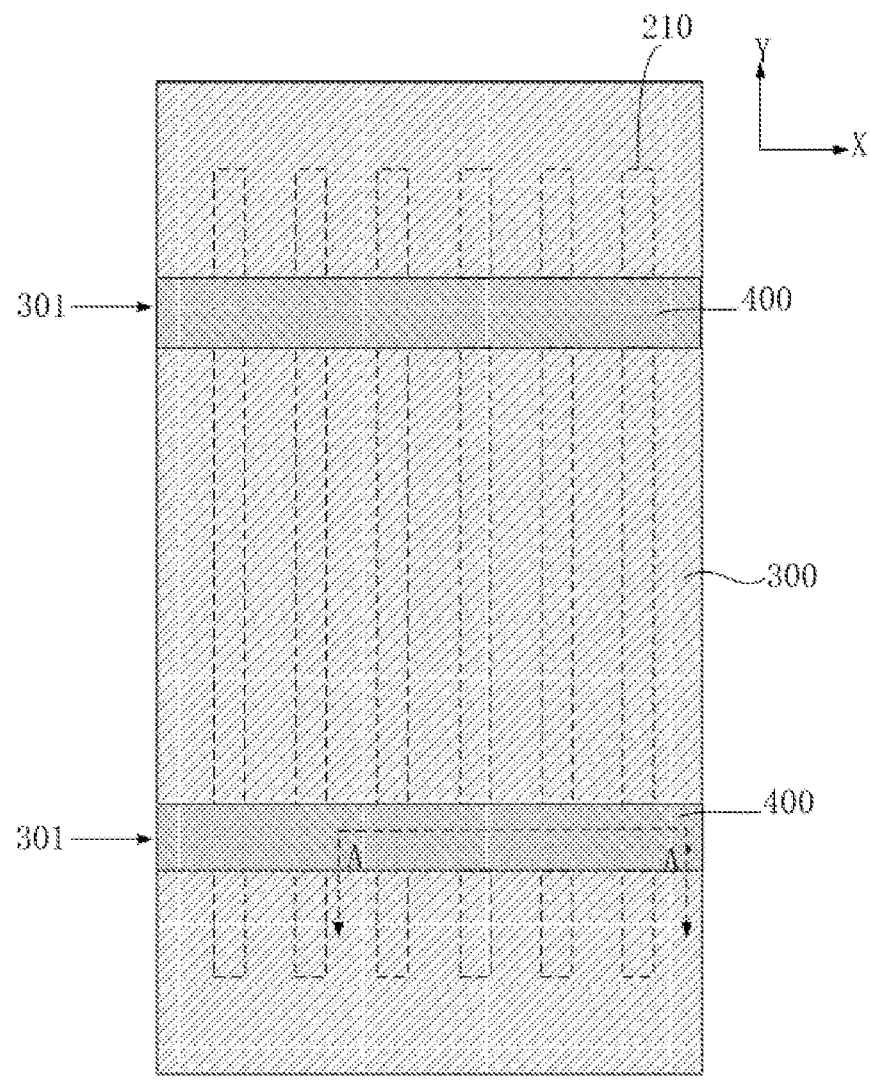
FIG. 6A is a top view after first trenches and second trenches are filled with a contact via layer according to an embodiment.
Figure 6B:
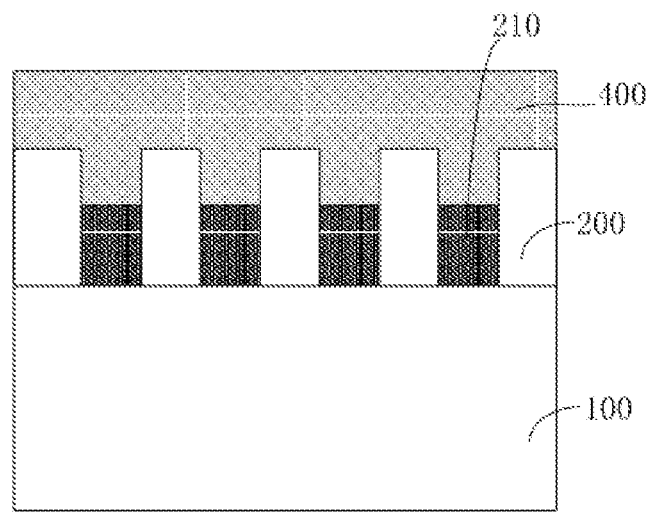
FIG. 6B is a sectional view corresponding to section line AA' in FIG. 6A according to an embodiment.

As shown in FIG. 6A and FIG. 6B, FIG. 6A is a top view after first trenches 201 and second trenches 301 are filled with a contact via layer 400, and FIG. 6B is a sectional view corresponding to section line AA' in FIG. 6A. A relatively thick layer of contact via material is deposited through the deposition process. The contact via material fills the exposed first trench 201 and second trench 301 and is higher than the second dielectric layer 300. Then, the contact via material is flattened through a polishing process to remove the contact via material above the second dielectric layer 300 and only retain the contact via material in the first trench 201 and the second trench 301 to form the needed contact via layer 400.

According to the abovementioned embodiment, the contact via layer 400 is formed through S311 to S313. In another embodiment, the needed contact via layer 400 may also be formed through the following sub steps S321 to S323.

In S321, the contact via material is deposited on the first dielectric layer 200 and the first trench 201.

In S322, the contact via material is etched to remove the contact via material on two sides to form the contact via layer 400 extending in the X-axis direction.

In S323, a second dielectric material is deposited, and the second dielectric layer is flattened to remove a second dielectric material layer above the contact via layer 400, expose the contact via layer 400 and retain the second dielectric material on two sides of the contact via layer 400 to form the second dielectric layer 300.

After the contact via layer 400 is formed through the abovementioned operations, the following operations are continued to be executed.

In S400, a metal layer is formed on the contact via layer.

Figure 7A:
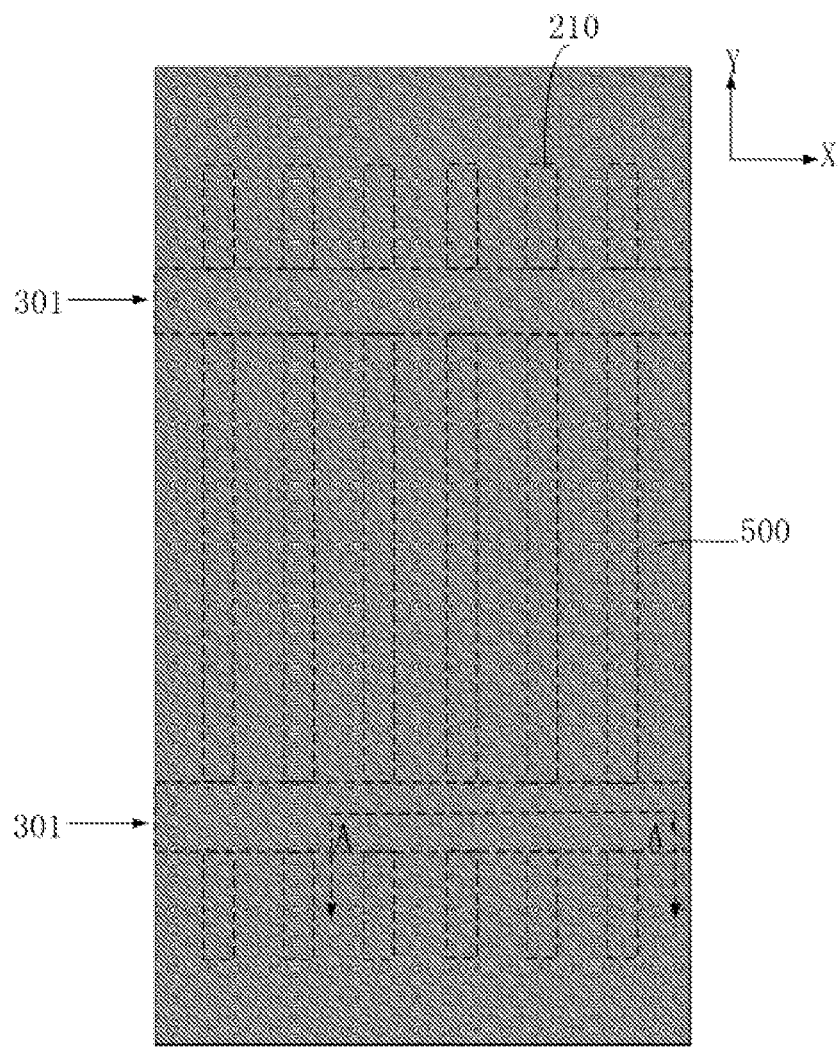
FIG. 7A is a top view after a metal layer is formed according to an embodiment.
Figure 7B:
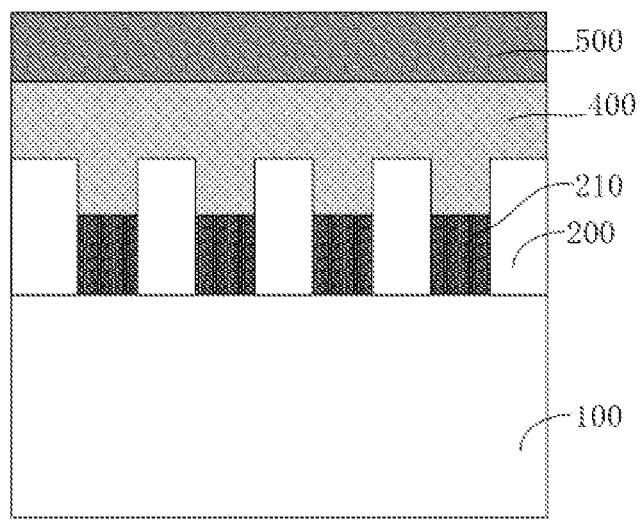
FIG. 7B is a sectional view corresponding to section line AA' in FIG. 7A according to an embodiment.

As shown in FIG. 7A and FIG. 7B, FIG. 7A is a top view after a metal layer 500 is formed, and FIG. 7B is a sectional view corresponding to section line AA' in FIG. 7A. The metal layer 500 is formed on the contact via layer 400 through the deposition process. In an embodiment, the contact via layer 400 is formed in the second trench 301, and the metal layer 500 is formed on the contact via layer 400 and the second dielectric layer 300.

In S500, the metal layer and the contact via layer are etched to form the bit line lead-out structure.

After the metal layer 500 is formed on the contact via layer 400, the metal layer 500 and the contact via layer 400 are etched. The metal layer 500 is etched to form a metal wire 510, and the contact via layer 400 is etched to form a contact via 410. As such, the bit line lead-out structure is formed. A positional relationship between the bit line 210, contact via 410, and metal wire 510 in the bit line lead-out structure has been introduced above and will not be elaborated herein.

In an embodiment, the operation that the metal layer 500 and the contact via layer 400 are etched specifically includes that: a mask is formed on the metal layer 500, the exposed metal layer 500 is etched downwards to form the metal wire 510 under the protection of the mask, and the exposed contact via layer 400 is continued to be etched downwards to form the contact via 410 under the protection of the metal wire 510. That is, etching of the contact via layer 400 is self-aligned etching. Boundaries of the contact via 310 and metal wire 510 formed after self-aligned etching are aligned, so that the influence of misalignment thereof on the electrical performance of a device is avoided.

In a specific embodiment, 2*N bit lines 210 are formed on the substrate 100, and the contact via layer 400 is formed in the second trench 301 and extends in the X-axis direction. In such case, S500 includes the following operations.

In S510, 2*N masks are formed on the metal layer, each mask crossing the second trench 301 in the Y-axis direction, and one mask covering one bit line in the X-axis direction.

Figure 8A:
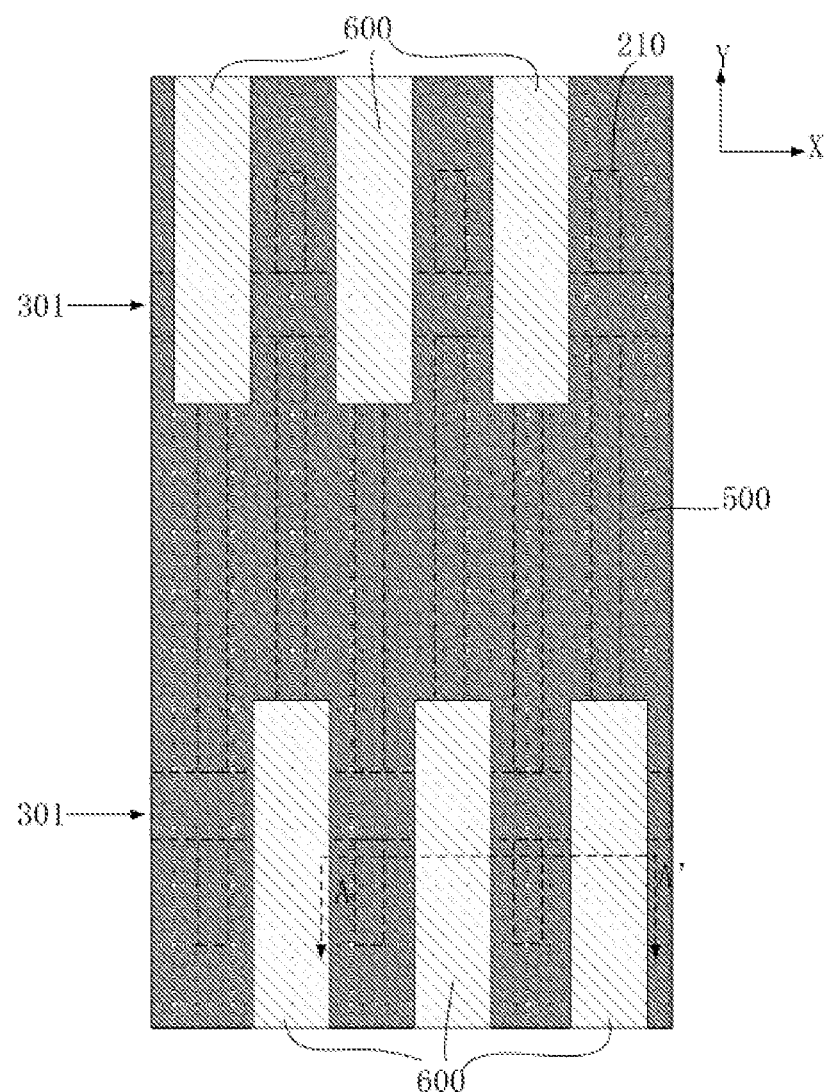
FIG. 8A is a top view after 2*N masks are formed according to an embodiment.
Figure 8B:
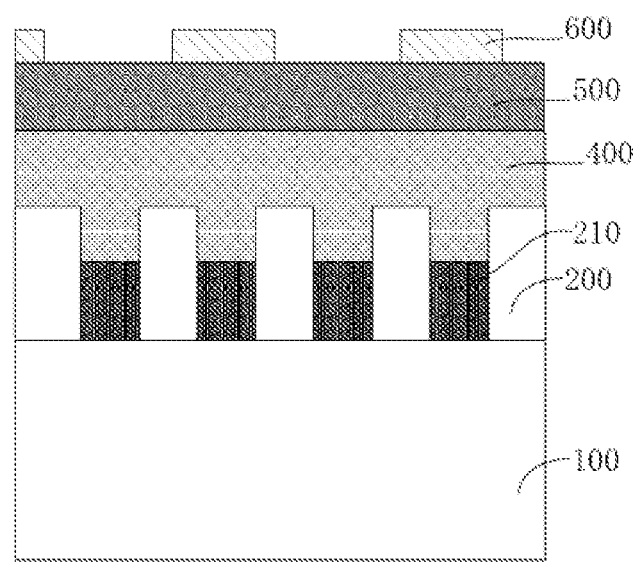
FIG. 8B is a sectional view corresponding to section line AA' in FIG. 8A according to an embodiment.

As shown in FIG. 8A and FIG. 8B, FIG. 8A is a top view after 2*N masks 600 are formed, and FIG. 8B is a sectional view corresponding to section line AA' in FIG. 8A. The 2*N masks 600 are formed on the metal layer 500, each mask 600 crosses the second trench 301 in the Y-axis direction, and one mask 600 covers one bit line 210 in the Y-axis direction, namely the 2*N masks 600 correspond to the 2*N bit lines 210 one to one. Furthermore, two second trenches 301 are formed in the second dielectric layer 300. When two contact via layers 400 extending in the X-axis direction are formed in the two second trenches 301 respectively, N masks 600 in the 2*N masks 600 are on one side of the metal layer 500 in the Y-axis direction, cross the second trench 301 on the same side in the Y-axis direction respectively, and cover odd-numbered bit lines 210 respectively, and the other N masks 600 are on the other side of the metal layer 500 in the Y-axis direction, cross the other second trench 301 on the same side in the Y-axis direction respectively, and cover even-numbered bit lines 210 respectively. Furthermore, the masks 600 on the same side are distributed in parallel in the X-axis direction.

In S520, the metal layer and the contact via layer are sequentially etched to retain the metal layer below the mask to form 2*N metal wires and retain the contact via layer below the metal wires to form 2*N contact vias, N being a positive integer, and the 2*N bit lines, the 2*N contact vias, and the 2*N metal wires corresponding one to one.

Figure 9A:
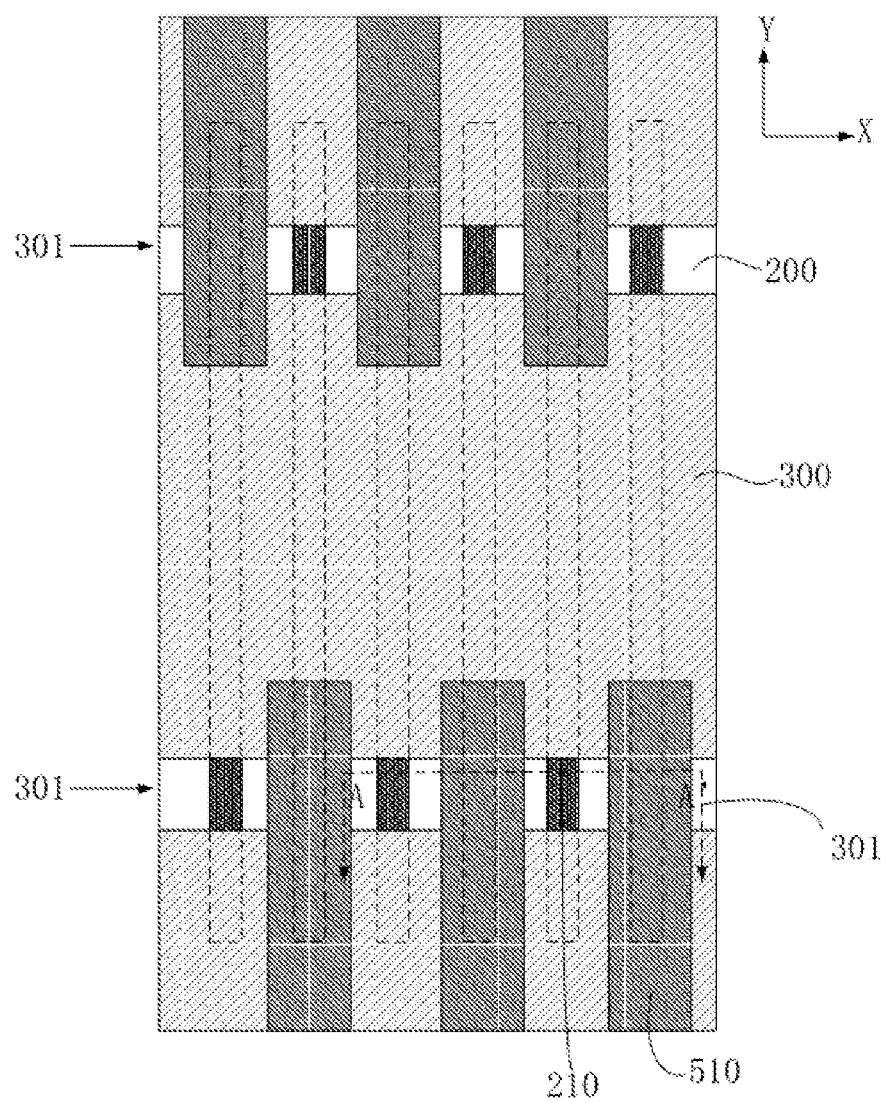
FIG. 9A is a top view after 2*N metal wires are formed according to an embodiment.
Figure 9B:
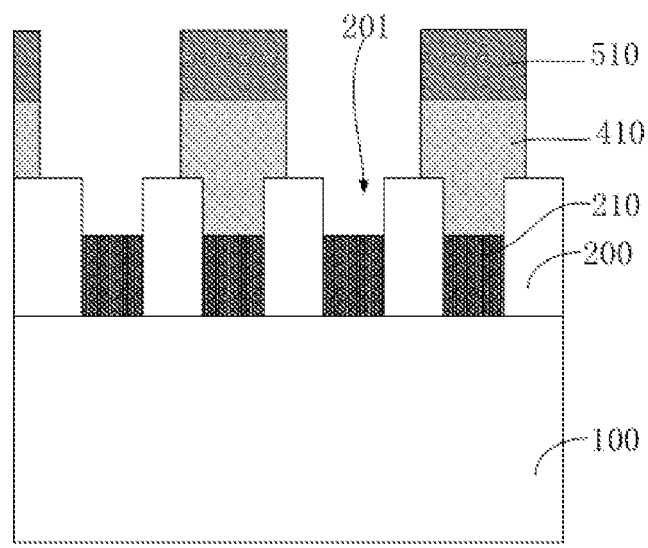
FIG. 9B is a sectional view corresponding to section line AA' in FIG. 9A according to an embodiment.

As shown in FIG. 9A and FIG. 9B, FIG. 9A is a top view after 2*N metal wires 510 are formed, and FIG. 9B is a sectional view corresponding to section line AA' in FIG. 9A. The exposed metal layer 500 is etched to form 2*N independent metal wires 510 under the protection of the 2*N masks, and the exposed contact via layer 400 is continued to be etched to form 2*N independent contact vias 410 under the protection of the metal wires 510. In such case, the 2*N bit lines 210, the 2*N contact vias 410, and the 2*N metal wires 510 correspond one to one, and each bit line 210 is led out through the contact via 410 and metal wire 510 above the bit line.

In the embodiment, the contact via layer 400 extending in the X-axis direction is formed at first, the contact via layer 400 being formed integrally and electrically connected with multiple bit lines 210. Then, the metal layer 500 is formed on the contact via layer 400 and the second dielectric layer 300, and the mask is formed on the metal layer 500, the mask crossing the second trench 301 in the Y-axis direction. Next, the exposed metal layer 500 and contact via layer 400 are sequentially etched under the occlusion of the mask, the contact via layer 400 extending in the X-axis direction is divided into multiple independent parts, and the unetched metal layer 500 and contact via layer 400 form the lead-out structure of the bit line 210. Since self-aligned etching is adopted for the contact via layer 400, alignment operations before and after etching in the conventional art are omitted. In the application, the boundaries of the metal layer 500 and contact via layer 400 retained after etching are flush, and positions of the metal layer 500 and the contact via layer 400 are not shifted, so that the electrical performance of the semiconductor device is greatly improved.

The bit line lead-out structure introduced above is formed through the preparation method for the bit line lead-out structure. The contact via 410 covers the bit line 210 in the X-axis direction, the metal wire 510 covers the contact via 410, and the contact area between the contact via 410 and the metal wire 510 is larger than the contact area between the contact via 410 and the bit line 210. In the above-mentioned bit line lead-out structure, after the contact areas between the contact via 410 and the bit line 210 and between the contact via 410 and the metal wire 510 are adjusted, when the contact area between the contact via 410 and the bit line 210 is smaller, the influence of the contact via 410 on an integration level of the device can be reduced, and when the contact area between the contact via 410 and the metal wire 510 is larger, contact resistance of the whole bit line lead-out structure can be reduced to improve an induction margin of a semiconductor memory and a charging and discharging speed of a storage capacitor.

The abovementioned embodiments only express some implementation modes of the disclosure and are specifically described in detail and not thus understood as limits to the patent scope of the disclosure. It is to be pointed out that those of ordinary skill in the art may further make a plurality of transformations and improvements without departing from the concept of the disclosure, and all of such fall within the scope of protection of the disclosure. Therefore, the scope of patent protection of the disclosure should be subject to the appended claims.

What is claimed is:

1. A bit line lead-out structure, comprising: a bit line, extending along a Y-axis direction; a contact via, covering the bit line along an X-axis direction, the X-axis direction being perpendicular to the Y-axis direction; and a metal wire, covering the contact via, the contact via being located between the bit line and the metal wire and in contact with the bit line and the metal wire, respectively, wherein a contact area between the contact via and the metal wire is larger than a contact area between the contact via and the bit line, wherein a cross section of the contact via is a T-shaped structure.

2. The bit line lead-out structure of claim 1, wherein the bit line lead-out structure comprises 2*N of the bit lines, 2*N of the contact vias, and 2*N of the metal wires;
   each of the bit lines is distributed in parallel along the X-axis direction; each of the metal wires extends along the Y-axis direction;
   wherein N is a positive integer, and 2*N of the bit lines, 2*N of the contact vias, and 2*N of the metal wires are in one-to-one correspondence.

3. The bit line lead-out structure of claim 2, wherein each of the bit lines is aligned in the X-axis direction.

4. The bit line lead-out structure of claim 2, wherein
   N of the metal wires and N of the contact vias are on one side of the bit lines in the Y-axis direction; and
   other N of the metal wires and other N of the contact vias are on another side of the bit lines in the Y-axis direction;
   wherein metal wires on a same side are distributed in parallel in the X-axis direction.

5. The bit line lead-out structure of claim 4, wherein
   contact vias on one side of the bit lines cover bit line that are odd-numbered; and
   contact vias on another side of the bit lines covers bit lines that are even-numbered.

6. The bit line lead-out structure of claim 1, wherein the contact via and the metal wire have different electrical conductivities.

7. A preparation method for a bit line lead-out structure, comprising:
   forming a first dielectric layer on a substrate, a first trench extending in a Y-axis direction being formed in the first dielectric layer;
   forming a bit line extending in the Y-axis direction in the first trench, a top surface of the bit line being lower than a top surface of the first dielectric layer;
   forming a contact via layer on the bit line and the first dielectric layer outside the first trench;
   forming a metal layer on the contact via layer; and
   etching the metal layer and the contact via layer to form the bit line lead-out structure of claim 1.

8. The preparation method of claim 7, wherein the forming the bit line in the first trench, the top surface of the bit line being lower than the top surface of the first dielectric layer, comprises:
   depositing a bit line material layer on the first dielectric layer in the first trench and outside the first trench;
   flattening a top surface of the bit line material layer and removing the bit line material layer on the first dielectric layer and retaining the bit line material layer in the first trench; and
   etching back the bit line material layer in the first trench, removing part of the bit line material layer at a top of the first trench and retaining part of the bit line material layer at a bottom of the first trench to form the bit line.

9. The preparation method of claim 7, wherein 2*N of the first trenches are formed in the first dielectric layer, 2*N of the bit lines are formed in the 2*N of the first trenches, and each of the bit line is distributed in parallel in an X-axis direction;
   the forming the contact via layer on the bit line and the first dielectric layer outside the first trench comprises:
   forming a second dielectric layer on the first dielectric layer and the first trench,
   etching the second dielectric layer to form a second trench extending in an X-axis direction, the second trench penetrating through the second dielectric layer and exposing the bit line and the first dielectric layer, and
   forming the contact via layer in the first trench and the second trench; and
   the etching the metal layer and the contact via layer comprises:
   forming 2*N masks on the metal layer, each of the masks crossing the second trench in the Y-axis direction, and one mask covering one bit line in the X-axis direction, and
   sequentially etching the metal layer and the contact via layer to retain the metal layer below the masks to form 2*N metal wires and retain the contact via layer below the metal wires to form 2*N contact vias, where N being a positive integer, and the 2*N bit lines, the 2*N contact vias, and the 2*N metal wires are in one-to-one correspondence.

* * * * *